(12) United States Patent
Wu

(10) Patent No.: US 8,218,319 B2
(45) Date of Patent: Jul. 10, 2012

(54) ELECTRONIC DEVICE WITH FIXING MEMBERS

(75) Inventor: Bao-Kun Wu, Shanghai (CN)

(73) Assignees: Ambit Microsystems (Shanghai) Ltd., Shanghai (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 176 days.

(21) Appl. No.: 12/828,297

(22) Filed: Jul. 1, 2010

(65) Prior Publication Data

US 2011/0292606 A1    Dec. 1, 2011

(30) Foreign Application Priority Data

May 28, 2010    (CN) .......................... 2010 2 0207630

(51) Int. Cl.
*H05K 7/20* (2006.01)
*F04D 29/64* (2006.01)
*F16B 19/00* (2006.01)
*F01D 25/28* (2006.01)

(52) U.S. Cl. .............. 361/695; 361/679.48; 361/679.49; 417/423.14; 417/423.15; 165/121; 165/122; 415/213.1; 411/339; 411/510; 403/168; 403/408.1; 24/453

(58) Field of Classification Search .................. 361/695, 361/679.48, 679.49; 417/423.14, 423.15; 165/122, 121, 80.3; 454/184, 186; 174/16.1; 415/119, 213.1; 411/339, 510; 403/168, 403/408.1; 24/453

See application file for complete search history.

(56) References Cited

U.S. PATENT DOCUMENTS

| | | | | |
|---|---|---|---|---|
| 5,316,423 A | * | 5/1994 | Kin ................................ | 411/510 |
| 5,788,566 A | * | 8/1998 | McAnally et al. ............. | 454/184 |
| 5,969,941 A | * | 10/1999 | Cho .......................... | 361/679.48 |
| 6,341,644 B1 | * | 1/2002 | Lo et al. ........................ | 165/80.3 |
| 6,351,380 B1 | * | 2/2002 | Curlee et al. .................. | 361/695 |
| 6,392,885 B1 | * | 5/2002 | Lee et al. ....................... | 361/697 |
| 6,485,260 B2 | * | 11/2002 | Orlowski et al. ........... | 415/213.1 |
| 6,662,411 B2 | * | 12/2003 | Rubenstein et al. ............. | 24/453 |
| 6,826,048 B1 | * | 11/2004 | Dean et al. ..................... | 361/695 |
| 6,950,306 B2 | * | 9/2005 | Huang et al. .................. | 361/697 |
| 7,145,771 B2 | * | 12/2006 | Wang ............................. | 361/695 |
| 7,255,529 B2 | * | 8/2007 | Ku et al. ....................... | 415/119 |
| 7,269,010 B2 | * | 9/2007 | Yu et al. ........................ | 361/697 |
| 7,369,408 B2 | * | 5/2008 | Chang ........................... | 361/697 |
| 7,384,210 B2 | * | 6/2008 | Sura et al. ..................... | 403/168 |

(Continued)

FOREIGN PATENT DOCUMENTS

JP    06097687 A    *    4/1994

*Primary Examiner* — Anatoly Vortman

(74) *Attorney, Agent, or Firm* — Altis Law Group, Inc.

(57) ABSTRACT

An electronic device includes a fan including a frame, an enclosure, and many fixing members engaged with the enclosure to fix the fan in the enclosure. The frame includes many mounting holes positioned in corners of the frame, respectively. The enclosure includes many sidewalls and many fixing members corresponding to the mounting holes. Each fixing member includes a base, a fixing portion extending from a top surface of the base, an angle shaped clasping portion extending from a sidewall of the base. Each base includes a locating block received in a corresponding locating member, and at least one fixing arms abuts against the corresponding locating member. Each fixing portion extends through the locating member and is received in a corresponding mounting hole. Each clasping portion extends through the corresponding locating member and clasps an inner wall of the corresponding mounting hole.

11 Claims, 4 Drawing Sheets

U.S. PATENT DOCUMENTS

| | | | |
|---|---|---|---|
| 7,405,933 B2 * | 7/2008 | Kobayashi et al. | 361/695 |
| 7,494,408 B2 * | 2/2009 | Chen et al. | 454/184 |
| 7,599,179 B2 * | 10/2009 | Chen et al. | 361/679.48 |
| 7,672,126 B2 * | 3/2010 | Yeh et al. | 361/695 |
| 7,729,122 B2 * | 6/2010 | Wong | 361/710 |
| 7,821,788 B2 * | 10/2010 | Hsiao | 361/695 |
| 7,821,789 B1 * | 10/2010 | Chou et al. | 361/695 |
| 7,826,224 B2 * | 11/2010 | Sun | 361/697 |
| 7,869,217 B2 * | 1/2011 | Chen et al. | 361/710 |
| 8,120,906 B2 * | 2/2012 | Li | 361/679.58 |
| 2006/0045737 A1 * | 3/2006 | Wung et al. | 415/220 |
| 2006/0126302 A1 * | 6/2006 | Lee et al. | 361/704 |
| 2007/0146991 A1 * | 6/2007 | Chen et al. | 361/695 |
| 2007/0155301 A1 * | 7/2007 | Chen et al. | 454/184 |
| 2007/0171612 A1 * | 7/2007 | Chen et al. | 361/695 |
| 2008/0227379 A1 * | 9/2008 | Hung | 454/184 |
| 2009/0141449 A1 * | 6/2009 | Yeh et al. | 361/695 |
| 2010/0014966 A1 * | 1/2010 | Zhou et al. | 415/220 |
| 2010/0104434 A1 * | 4/2010 | Sun | 415/213.1 |
| 2010/0290185 A1 * | 11/2010 | Hung | 361/692 |
| 2011/0021132 A1 * | 1/2011 | Chou et al. | 454/184 |

* cited by examiner

ELECTRONIC DEVICE WITH FIXING MEMBERS

BACKGROUND

1. Technical Field

The present disclosure relates to electronic devices, and more particularly to an electronic device with fixing members to fix a fan in the electronic device.

2. Description of Related Art

In electronic devices, such as desktop computers, servers, and Internet appliances, for example, fans are required to dissipate heat generated by electronic elements received in the electronic devices, such as central processing units (CPUs) and integrated circuits (ICs), for example. A frequently used fan is directly fixed in an enclosure of the electronic device with screws, resulting in inconvenience of assembly or disassembly of the fan.

Therefore, a need exists in the industry to overcome the described limitations.

DETAILED DESCRIPTION

Figure 1:
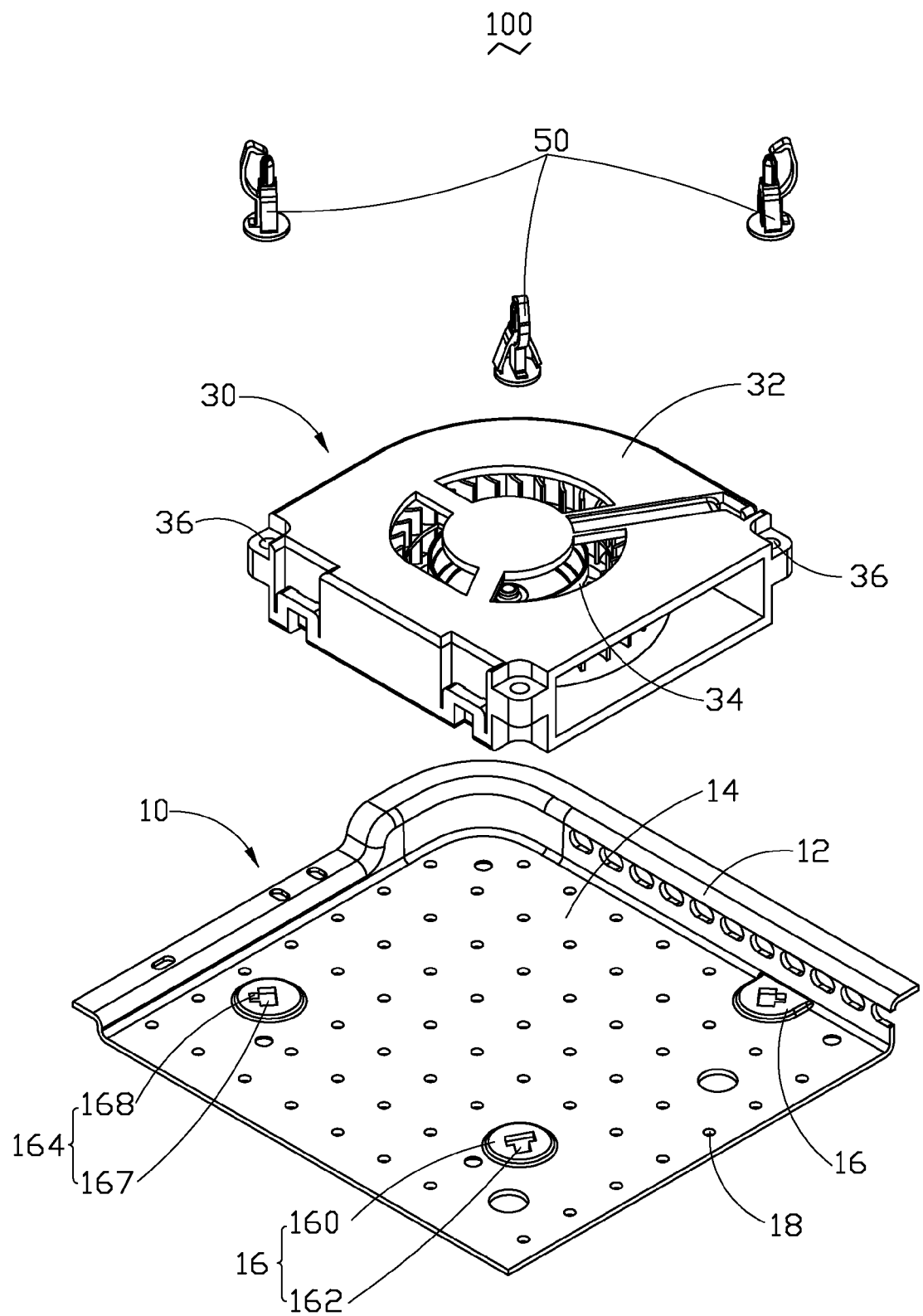
FIG. 1 is an exploded, isometric view of an electronic device of an exemplary embodiment of the disclosure, the electronic device including an enclosure and a plurality of fixing members.

Referring to FIG. 1, an electronic device 100 of an exemplary embodiment of the disclosure is illustrated. The electronic device 100 includes an enclosure 10, a fan 30, and a plurality of fixing members 50 to fix the fan 30 in the enclosure 10. The electronic device 100 may be a computer, or an Internet appliance, but the disclosure is not limited thereto.

The enclosure 10 accommodates electronic elements, such as, printed circuit boards (PCBs), batteries, and/or a central processing unit (CPU), for example. The enclosure 10 is substantially rectangular and it will be understood that other configurations may be utilized. The enclosure 10 includes a plurality of sidewalls 12 and a receiving space 14 surrounded by the sidewalls 12 to receive the electronic elements.

Figure 2:
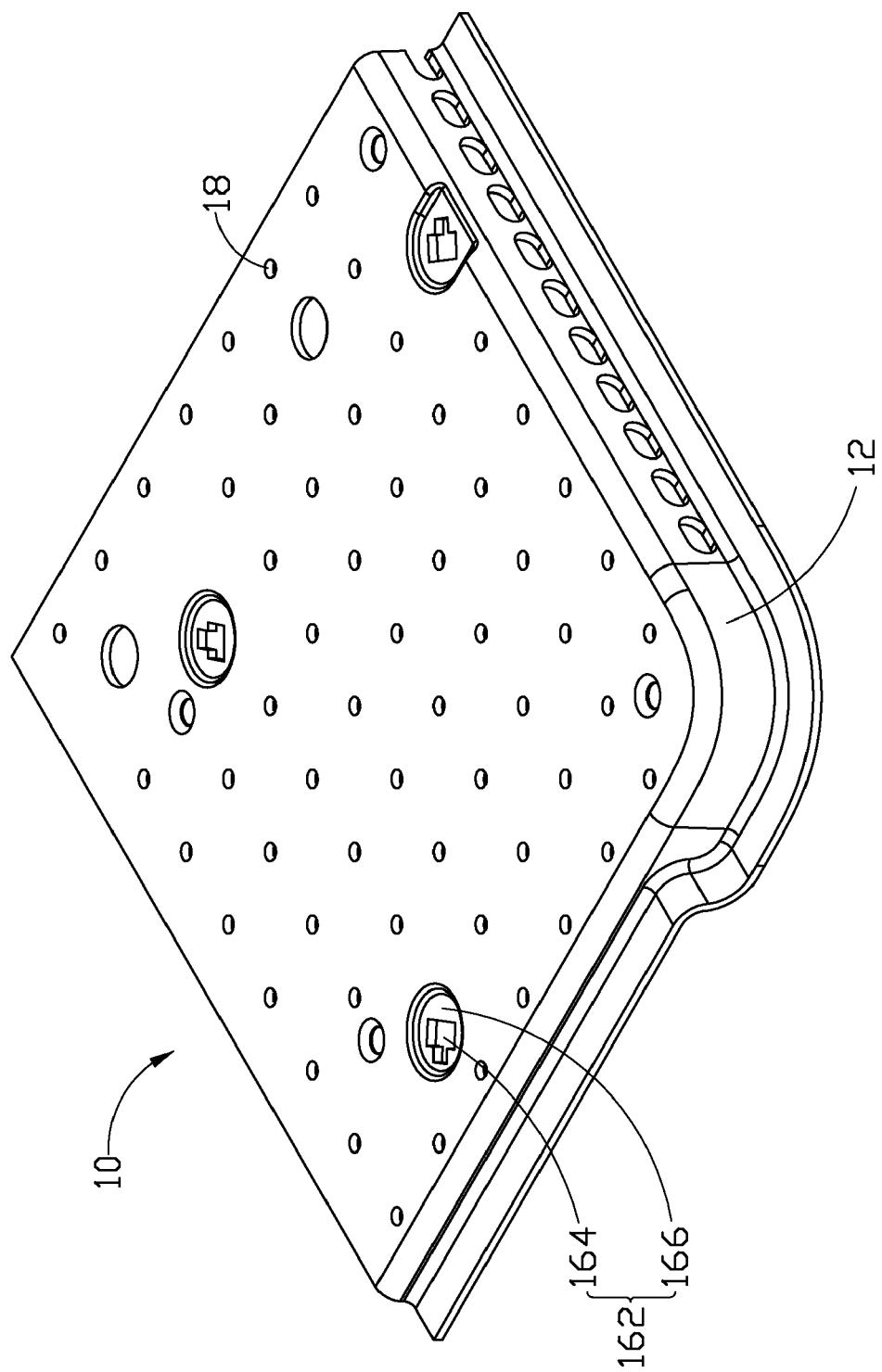
FIG. 2 is an inverted, isometric view of the enclosure of FIG. 1.

Referring also to FIG. 2, the enclosure 10 further includes a plurality of locating members 16 and a plurality of holes 18. Each of the locating members 16 includes a protrusion portion 160 and a receiving member 162. The receiving member 162 includes a T-shaped receiving portion 164 and a recess portion 166 in communication with the receiving portion 164. The protrusion portions 160 project from an outer surface of one of the sidewalls 12 into an inner surface of the one of the sidewalls 12, thereby the recess portions 166 are formed in the outer surface of the one of the sidewalls 12. After assembly, the fan 30 is supported by the protrusion portions 160, facilitating decreasing noise generated by the fan 30.

Each of the receiving portions 164 is located in a middle portion of a corresponding protrusion portion 160. Each of the receiving portions 164 includes a through hole 167 and a locating hole 168. A diameter of the locating hole 168 is less than a diameter of the through hole 167.

The heat holes 18 are arranged in the one of the sidewalls 12 to dissipate heat generated by the electronic elements.

The fan 30 is mounted in the enclosure 10 to dissipate the heat generated by the electronic elements, and includes a frame 32 to fix the fan 30 in the enclosure 10. The frame 32 includes a vent 34 located in a bottom thereof and corresponding to the plurality of holes 18, and a plurality of mounting holes 36 corresponding to the locating members 16. The mounting holes 36 are positioned in three corners of the frame 32, respectively.

Figure 3:
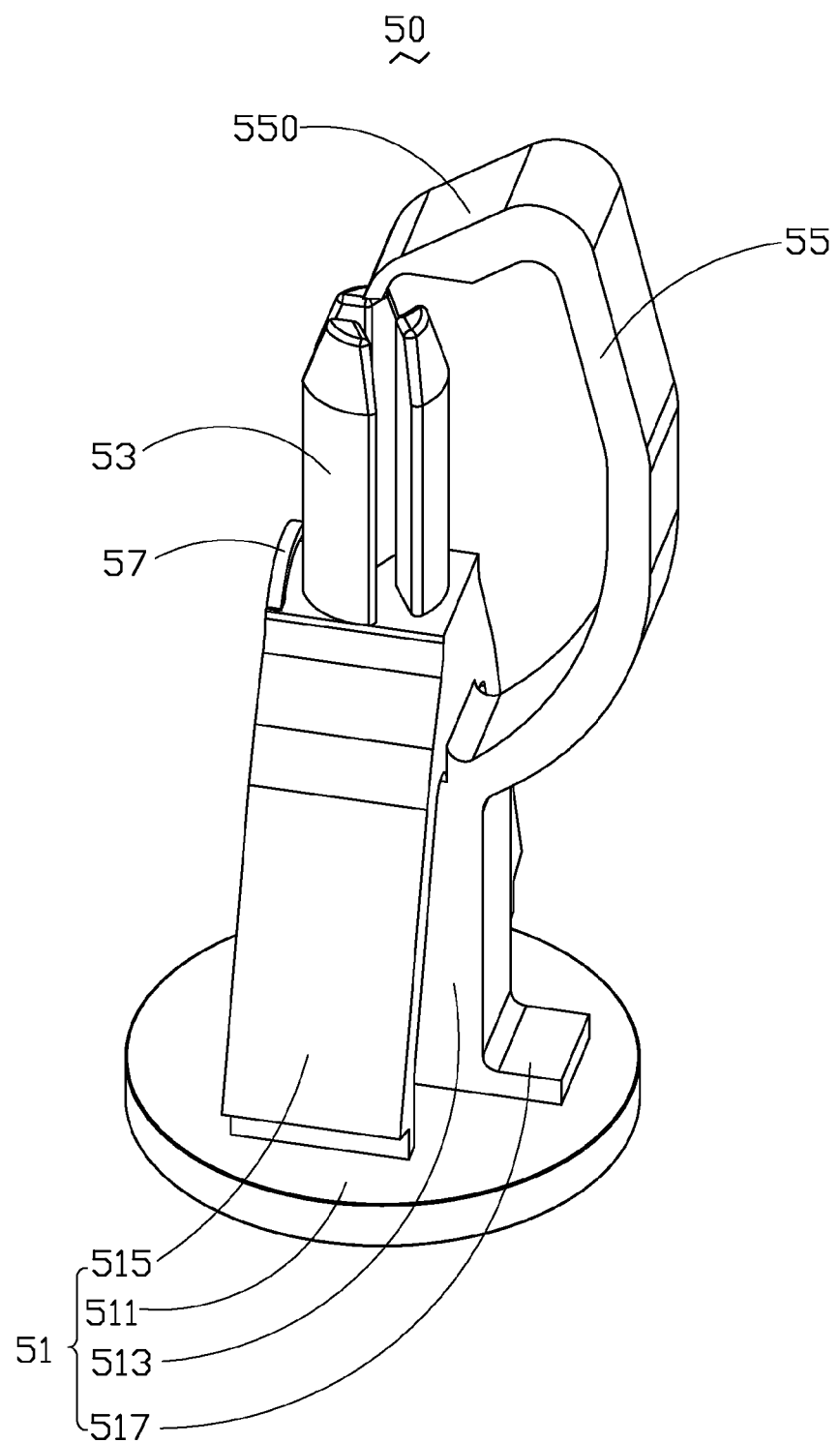
FIG. 3 is an enlarged, isometric view of one of the fixing members of FIG. 1.
Figure 4:
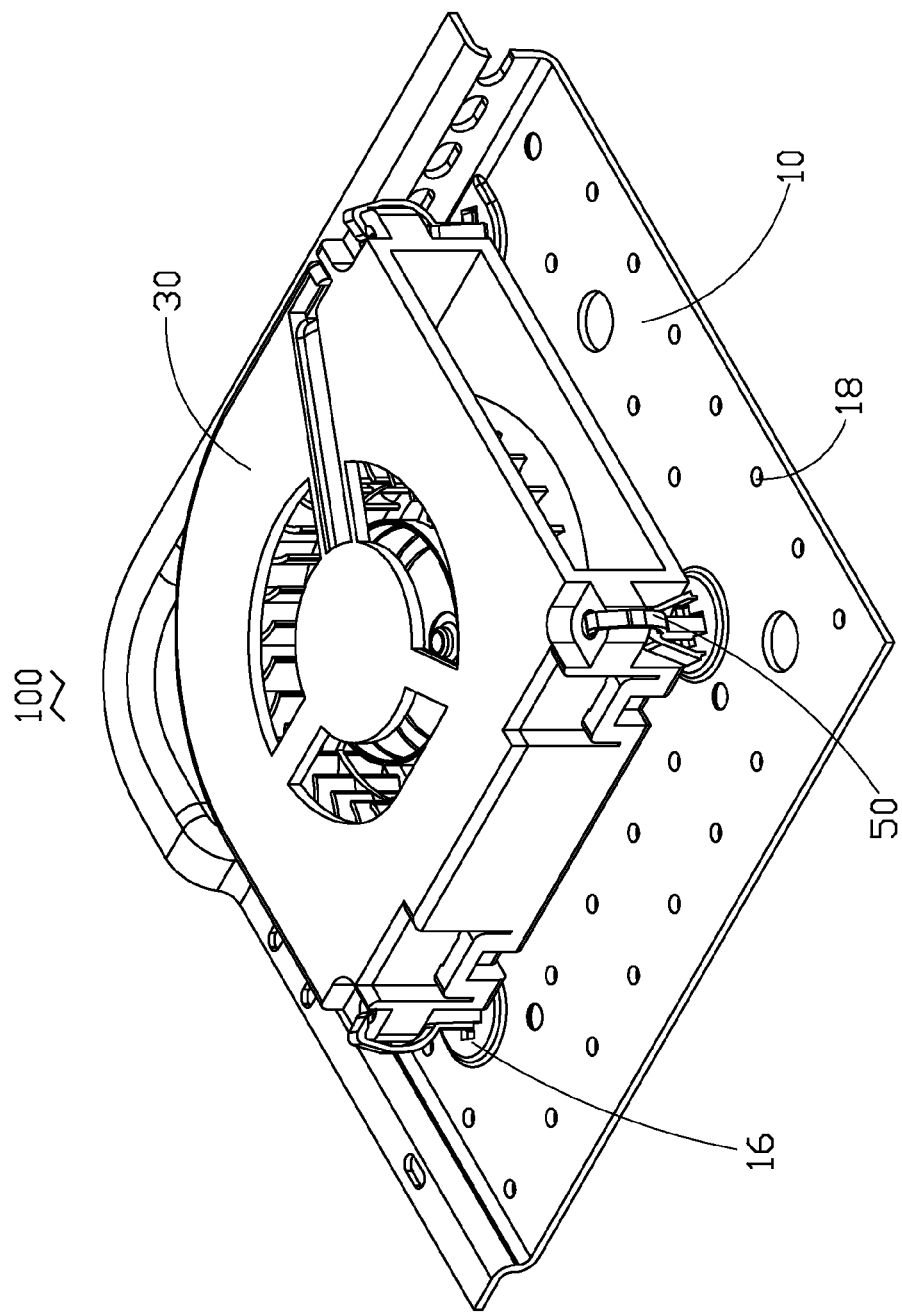
FIG. 4 is an assembled view of FIG. 1.

Referring to FIG. 3, each of the fixing members 50 includes a base 51, a fixing portion 53, an L-shaped clasping portion 55, and a pair of resilient ribs 57. The base 51 includes a circular bottom plate 511, a main body 513 projecting from a surface of the bottom plate 511, and a pair of fixing arms 515, and a rectangular locating block 517. A diameter of the bottom plate 511 is greater than a biggest diameter of the receiving portion 164, and is less than a diameter of the recess portion 166. After assembly, the bottom plate 511 is completely hidden in the recess portion 166.

The fixing arms 515 extend angularly from two opposite sidewalls of the main body 513 to the bottom plate 511. Each of the fixing arms 515 is resilient, facilitating extension of the fixing arms 515 through the receiving portions 164.

The locating block 517 projects from an inner surface of the bottom plate 511. The locating block 517 is received in a corresponding locating hole 168 of the enclosure 10 to avoid rotation by the fixing member 50 relative to the enclosure 10.

The resilient ribs 57 project from two opposite sides of a top surface of the main body 513 to support the fan 30 resiliently.

The fixing portion 53 extends from the top surface of the main body 513 to fix the fan 30 in the fixing member 50. In one embodiment, each of the fixing portions 53 includes three separated fixing posts, facilitating insertion of the fixing portions 53 into the mounting holes 36 of the fan 30 and the absorbability of vibration of the fan 30 during use.

The clasping portion 55 extends angularly from a sidewall of the main body 513 between the fixing arms 515. The clasping portion 55 includes a hook 550 located at a distal end thereof. In other embodiment, the clasping portion 55 may form other angled shapes besides an L-shaped, such as C-shaped.

In assembly, the clasping portion 55, the fixing portion 53, the main body 513, the fixing arms 515, and the resilient ribs 57 of each of the fixing members 50 extend through a corresponding through hole 167 of the enclosure 10 with insertion of the fixing portion 53 into the mounting hole 36 of the fan 30 until a bottom wall of the fan 30 abuts against the resilient ribs 57 and the hooks 550 of the clasping portions 55 clasp inner walls of the mounting holes 36, thus the fan 30 is fixed in the enclosure 10 by the fixing members 50. In the assembled state, the fan 30 is fixed between hooks 550 of the clasping portion 55 and the resilient ribs 57. Each of the locating blocks 517 is received in the corresponding locating hole 168 of the enclosure 10, and the fixing arms 515 abuts against the protrusion portion 160, so that the base 51 is engaged with the corresponding locating member 16.

In disassembly, the fan 30 can be disengaged from the fixing members 50 if the hooks 550 of the clasping portions 55 disengage from the inner walls of the mounting holes 36 of the fan 30.

In the assembled state, the bottom wall of the fan 30 abuts against the resilient ribs 57. In other words, the fan 30 is mounted on a resilient cushion so that vibration of the fan 30 is substantially absorbed by the resilient ribs 57 during use.

The fan 30 is fixed in the enclosure 10 of the electronic device 100 by the fixing members 50 rather than screws, resulting in a greater convenience of assembly or disassembly of the fan 30.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising
    a fan comprising a frame comprising a plurality of mounting holes positioned in a plurality of corners of the frame respectively;
    an enclosure comprising a plurality of sidewalls and a plurality of locating members arranged on one of the sidewalls and corresponding to the mounting holes; and
    a plurality of fixing members engaged with the locating members to fix the fan in the enclosure, each of the fixing members comprising a base, a fixing portion extending from a top surface of the base, and an angle shaped clasping portion extending from a sidewall of the base, wherein each of the bases comprises a locating block received in a corresponding locating member, and at least one fixing arm abutting against the corresponding locating member;
    wherein each of the fixing portions extends through the locating member and is received in the corresponding mounting hole, and wherein each of the clasping portions extends through the corresponding locating member and clasps an inner wall of the corresponding mounting hole.

2. The electronic device as recited in claim 1, wherein each of the clasping portions is substantially L-shaped or C-shaped.

3. The electronic device as recited in claim 2, wherein each of the clasping portions includes a hook located at a distal end of the clasping portion.

4. The electronic device as recited in claim 1, wherein each of the fixing portions comprises a plurality of separated fixing posts.

5. The electronic device as recited in claim 1, wherein each of the bases comprises a bottom plate and a main body, wherein the main body and the locating block projects from a surface of the bottom plate.

6. The electronic device as recited in claim 5, wherein each of the locating members comprises a T-shaped receiving portion.

7. The electronic device as recited in claim 6, wherein the receiving portion comprises a locating hole, wherein each of the locating blocks is received in a corresponding locating hole.

8. The electronic device as recited in claim 6, wherein each of the locating members comprises a recess portion in communication with the receiving portion, wherein the bottom plate is hidden in the recess portion.

9. The electronic device as recited in claim 5, wherein each of the fixing members comprises a plurality of resilient ribs projecting from a top surface of the main body.

10. The electronic device as recited in claim 5, wherein each of the fixing arms extends angularly from a sidewall of the main body to the bottom plate.

11. The electronic device as recited in claim 10, wherein each of the locating members comprises a protrusion portion, wherein each of the fixing arms abuts against the protrusion portion.

\* \* \* \* \*